(12) United States Patent
Miyajima

(10) Patent No.: US 6,770,236 B2
(45) Date of Patent: Aug. 3, 2004

(54) METHOD OF RESIN MOLDING

(75) Inventor: Fumio Miyajima, Nagano (JP)

(73) Assignee: APIC Yamada Corp., Nagano (JP)

( * ) Notice: Subject to any disclaimer, the term of this patent is extended or adjusted under 35 U.S.C. 154(b) by 0 days.

(21) Appl. No.: 09/933,950

(22) Filed: Aug. 22, 2001

(65) Prior Publication Data

US 2002/0025352 A1 Feb. 28, 2002

(30) Foreign Application Priority Data

Aug. 22, 2000 (JP) ........................................ 2000-250707
Dec. 11, 2000 (JP) ........................................ 2000-375517

(51) Int. Cl.[7] ........................... B29C 45/02; B29C 45/14
(52) U.S. Cl. .................. 264/511; 264/102; 264/272.15; 264/272.17; 264/276
(58) Field of Search ............................... 264/510, 511, 264/102, 266, 272.14, 272.15, 272.17, 276, 316; 425/89, 116, 121, 123, 125, 544, 546, 572, 812; 438/126, 127

(56) References Cited

U.S. PATENT DOCUMENTS

| | | | | |
|---|---|---|---|---|
| 5,800,841 A | * | 9/1998 | Miyajima | .................... 425/89 |
| 5,824,252 A | * | 10/1998 | Miyajima | ............... 264/272.17 |
| 5,891,384 A | * | 4/1999 | Miyajima | .................... 264/511 |
| 5,891,483 A | * | 4/1999 | Miyajima | ...................... 425/89 |
| 6,187,243 B1 | * | 2/2001 | Miyajima | .............. 264/272.15 |
| 6,261,501 B1 | * | 7/2001 | Miyagawa et al. | ..... 264/272.15 |
| 6,344,162 B1 | * | 2/2002 | Miyajima | .............. 264/272.14 |
| 6,439,869 B1 | * | 8/2002 | Seng et al. | .................... 425/89 |
| 6,444,157 B1 | * | 9/2002 | Miyajima | .................... 264/511 |
| 6,478,562 B1 | * | 11/2002 | Miyajima | ...................... 425/89 |

FOREIGN PATENT DOCUMENTS

| | | |
|---|---|---|
| JP | 11-274197 | 10/1999 |
| JP | 2001-168121 | 6/2001 |

* cited by examiner

*Primary Examiner*—Angela Ortiz
(74) *Attorney, Agent, or Firm*—Birch, Stewart, Kolasch & Birch, LLP

(57) ABSTRACT

In the method of resin molding of the present invention, air can be perfectly discharged from a specific area of a molding die including cavities, resin paths, pots, etc. so as to mold high quality products. The method comprises the steps of: covering a specific area of a molding die, in which air is left, with release film; clamping a work piece and the release film between an upper die and a lower die of the molding die so as to air-tightly seal the specific area; discharging the air from the sealed specific area; and filling a molding section with resin.

10 Claims, 12 Drawing Sheets

METHOD OF RESIN MOLDING

BACKGROUND OF THE INVENTION

The present invention relates to a method of resin molding and a resin molding machine.

In conventional resin molding machines for molding work pieces, e.g., semiconductor devices, the work pieces are clamped by a molding die, resin is melted and exerted in a pot, and cavities of the molding die are filled with the molten resin to mold the work pieces. When the cavities are filled with the resin, air in the cavities must be discharged. To discharge the air, an air vent is formed in a clamping member of the molding die. The air left in the cavities is discharged via the air vent.

In another way, the air left in cavities and resin paths of the molding die, which has clamped work pieces, is discharged by sucking air. The air is sucked by a vacuum unit. In this way, cavities, resin paths and pots, in which air is left, are air-tightly sealed, then the air left is discharged therefrom and the work pieces are molded with resin.

However, the method, in which air left in cavities, etc. is discharged and work pieces are molded with resin, has following disadvantages. A sealing member or members, which air-tightly seal the area including the cavities, etc., are provided on a parting face or faces of the molding die and projected therefrom. If a projecting length of the sealing member is too long, a cleaner cannot fully clean the molding die, so that disused resin is left in the molding die and badly influences the next molding process. And if the sealing member collides with cleaning brushes, the sealing member is damaged. On the other hand, if the projecting length of the sealing member is too short, the molding die can be well cleaned but sealing efficiency must be lower. Further, the molding die is always heated, so the sealing member is apt to be deteriorated by heat and sealing effect must be lower. By the lower sealing effect, the air in the molding die cannot be fully discharged, so that the air left badly influences molded products. As described above, the conventional methods cannot fully discharge air from the cavities, etc. of the molding die, and quality of the molded products are not satisfied.

Note that, in the case of molding a semiconductor chip connected to a substrate by flip-chip connection, a space (a connecting portion) between the chip and the substrate is filled with resin filler. In a conventional method, the connecting portion is filled by potting the filler, but it is difficult to correctly potting the filler into the connecting portion. To correctly fill the filler, the applicant of the present invention invented a method, in which the connecting portion is filled, with the resin filler, by a transfer molding machine (see Japanese Patent Gazette No. 11-274197). But, in the method executed by the transfer molding machine too, the air should be discharged from the area, in which air is left.

SUMMARY OF THE INVENTION

An object of the present invention is to provide a method of resin molding, in which air can be perfectly discharged from a specific area of a molding die including cavities, resin paths, pots, etc. so as to mold high quality products.

Another object of the present invention is to provide a resin molding machine executing the method of the present invention.

To achieve the objects, the present invention has following structures.

Firstly, the method of the present invention comprises the steps of:
  covering a specific area of a molding die, in which air is left, with release film;
  clamping a work piece and the release film between an upper die and a lower die of the molding die so as to air-tightly seal the specific area;
  discharging the air from the sealed specific area; and
  filling a molding section with resin.

Secondly, the resin molding machine of the present invention comprises:
  a molding die having an upper die and a lower die, which clamp a work piece with release film;
  a pot being formed in the molding die, the pot exerting and sending resin so as to mold the work piece;
  a film feeding mechanism feeding the release film onto a parting face of at least one of the upper die and the lower die;
  a sealing mechanism being provided to the parting face of at least one of the upper die and the lower die, the sealing mechanism enclosing and pressing the release film so as to air-tightly seal a specific area of the molding die, in which air is left, when the upper die and the lower die clamp the work piece and the release film; and
  an air sucking mechanism being communicated to the specific area enclosed by the sealing mechanism, the air sucking mechanism discharging air from the molding die.

In the present invention, the specific area, e.g., a cavity, a pot, a resin path, of a molding die, in which air is left, is covered with the release film, and the work piece is clamped by the molding die together with the release film, so that the specific area can be air-tightly sealed. Further, the air left in the specific area can be compulsorily and perfectly discharged from the sealed specific area. Therefore, no air is involved in the resin for molding the work piece, so that no voids are formed in molded products and high quality products can be produced.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

(First Embodiment)

Figure 1:
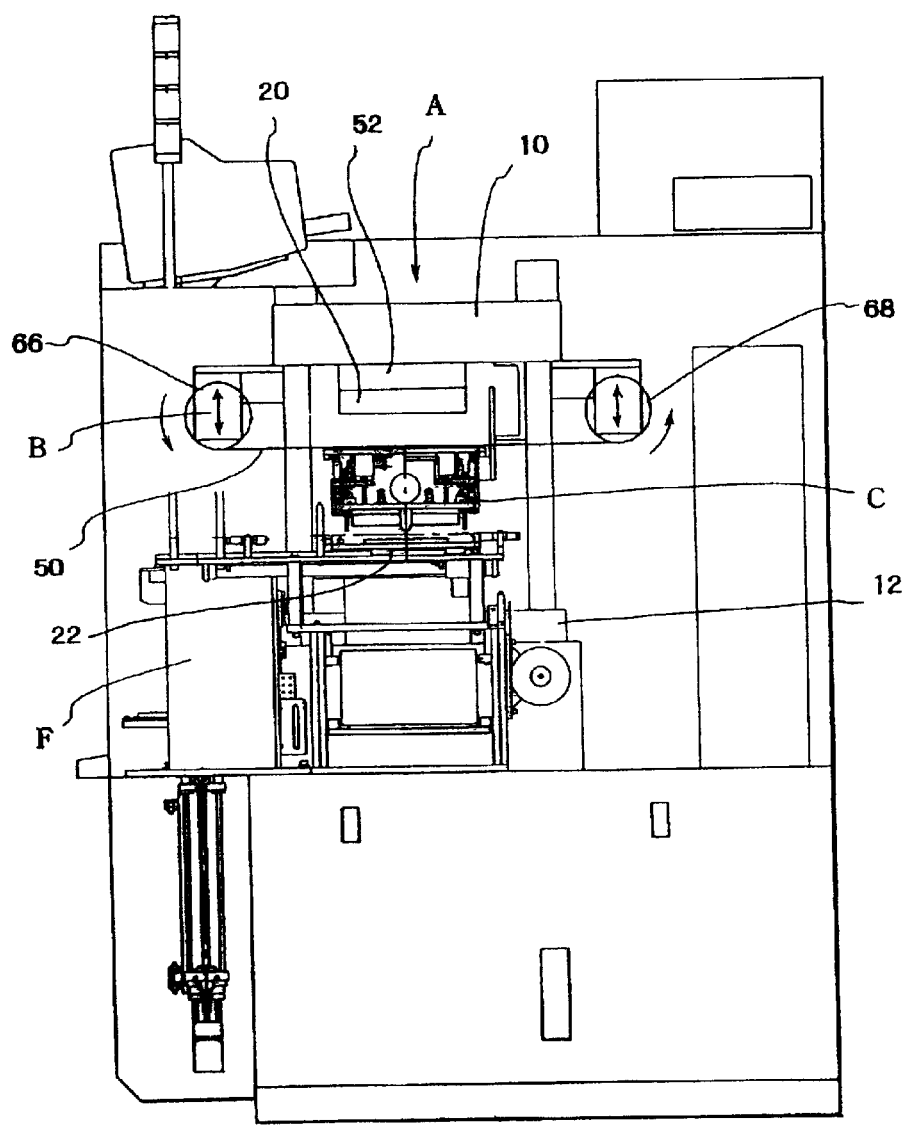
FIG. 1 is a side view of a resin molding machine of a first embodiment.

FIG. 1 shows a side view of a resin molding machine of the present embodiment. In FIG. 1, a press section "A" includes: a fixed platen 10 for holding an upper die 20; a movable platen 12 for holding a lower die 22; a clamping mechanism for vertically moving the movable platen 12; and a transfer mechanism for sending molten resin from pots to cavities. The upper die 20 and the lower die 22 constitute a molding die. The resin molding machine further has: a film feeding mechanism "B", which feeds release film 50 for covering a parting face of the upper die 20; and a cleaner "C" for cleaning surfaces of the molding die.

In the film feeding mechanism "B", a film feeding roller 66 is provided a front side of the press section "A"; a film collecting roller 68 is provided on the other side thereof. The new release film 50 is sent from the film feeding roller 66; the used release film 50 is collected by the film collecting roller 68. By collecting the release film by the film collecting roller 68, the new release film 50 can be supplied. In the present embodiment, width of the release film 50 is designed to wholly cover the parting face of the upper die 20.

By covering the parting face with the release film 50, no resin is stuck onto the parting face. The release film 50 is supplied onto the heated molding die, so the release film 50 must have enough heat-resistivity. Further, the release film 50 must be easily peelable from the molding die. Therefore, the release film 50 is made of, for example, FEP film, PET film, glass cloth including fluorine, polyvinylidene chloride, ETFE film.

Figure 2:
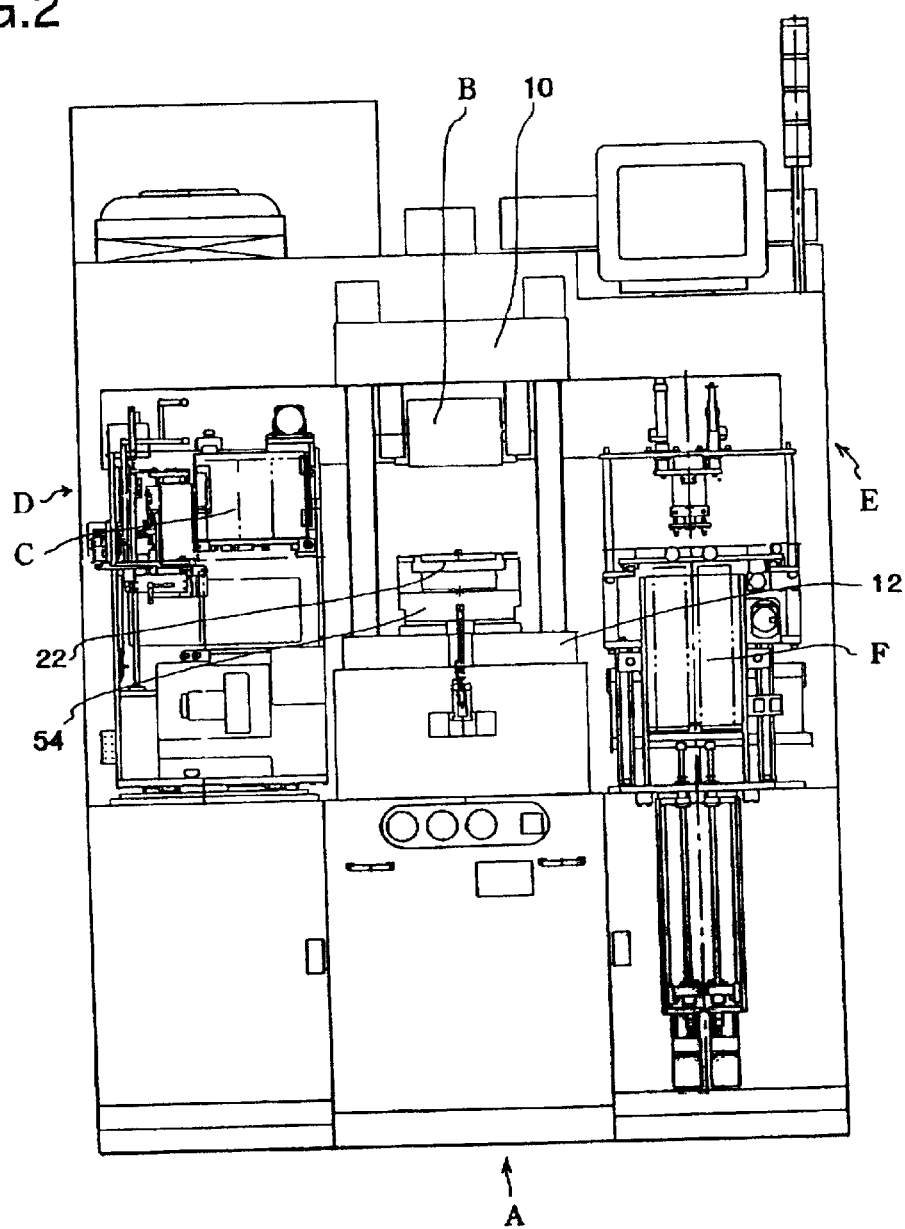
FIG. 2 is a front view of the resin molding machine of the first embodiment.

FIG. 2 is a front view of the resin molding machine. In FIG. 2, a loader section "D" arranges work pieces and resin tablets and supplies them to the press section "A". An unloader section "E" takes out molded products from the press section "A". An accommodating section "F" accommodates the molded products, whose disused resin, e.g., gates, have been removed.

Functions of the sections "A"-"F" are equal to those of the conventional resin molding machine. Namely, the loader section "D" picks up the work pieces and the resin tablets, which have been arranged to correspond to positions of pots and cavities of the press section "A". The loader section "D" enters the press section "A", whose molding die has been opened, and drops the resin tablets into the pots. Simultaneously, the work pieces are set in the lower die 22. Then the molding die is closed, and cavities of the molding die are filled with the resin, which has been melted in the pots. After the resin is solidified, the molding die is opened, and the unloader section "E" takes out the molded products from the press section "A" to remove the disused resin of the molded products. After the disused resin is removed from the molded products, the molded products are accommodated in the accommodating section "F". After the molded products are taken out, the cleaner "C" enters the press section "A" to clean a surface of the molding die.

Since the parting face of the upper die 20 is covered with the release film 50, the cleaner "C" cleans the surface of the lower die 22 only.

A feature of the resin molding machine of the present embodiment is to discharge air left in specific areas of the molding die, which include the cavities, resin paths and the pots, by a vacuum unit. The work pieces are molded with the resin after the air is perfectly discharged from the specific areas. A mechanism for compulsorily discharging air will be explained.

Figure 3:
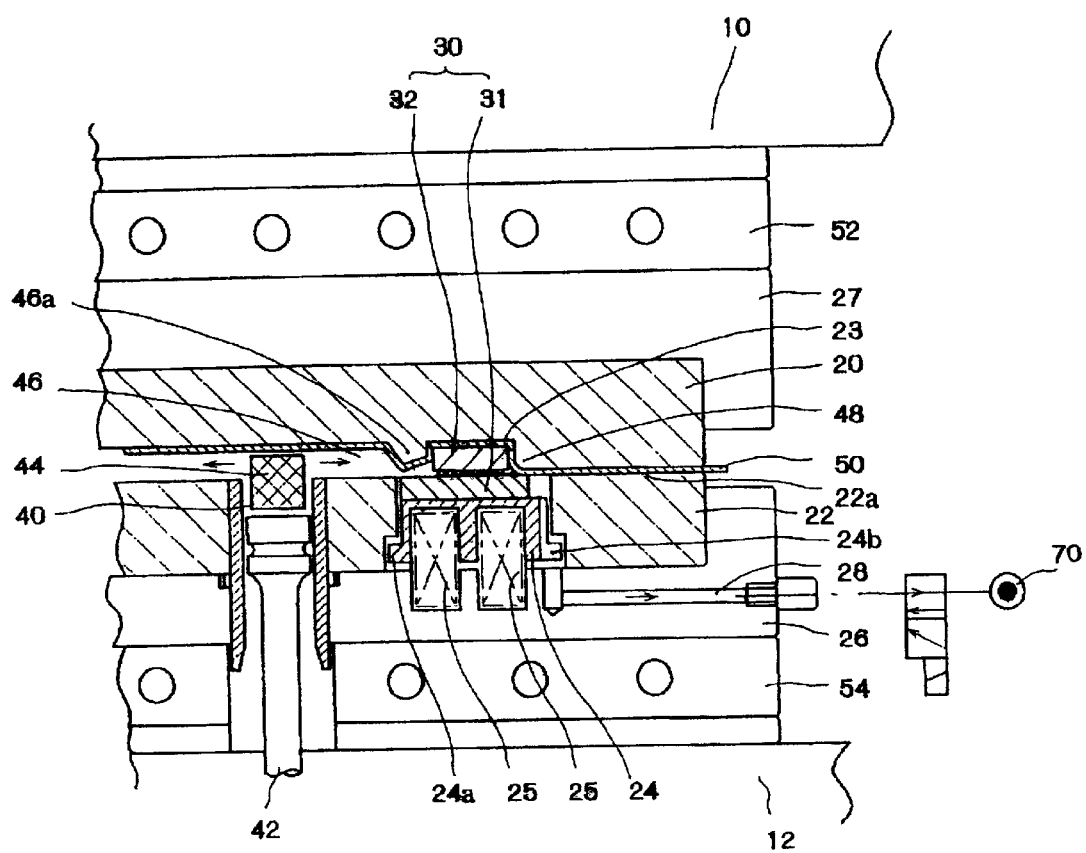
FIG. 3 is a sectional view of a molding die of the first embodiment.

FIG. 3 is a sectional view, in which the work piece 30 is clamped between the upper die 20 and the lower die 22 together with the release film 50. The work piece 30 includes a substrate 31 and a semiconductor chip 32, which are connected by flip-chip connection. A connecting portion between the substrate 31 and the semiconductor chip 32 is filled with the resin.

In the present embodiment, a concave section 23 for accommodating the semiconductor chip 32 is formed in the upper die 20; another concave section for accommodating the substrate 31 is formed in the lower die 22. The parting face of the upper die 20 is covered with the release film 50. The work piece 30 is molded with the resin in this state. Dimensions of the concave section 23 of the upper die 20 are corresponded to those of the semiconductor chip 32 so as not to stick the resin onto outer faces of the semiconductor chip 32 when resin molding is executed. The outer faces of the semiconductor chip 32 other than the connecting portion are covered with the release film 50 while resin molding is executed.

As shown in FIG. 3, the concave section of the lower die 22 is formed by providing a movable block 24, which is capable of moving in the open-close direction of the molding die, in the molding die. A spring 25 is provided between a rear face of the movable block 24 and a fixed block 26. With this structure, the movable block 24 is always biased toward the upper die 20. A stopper 24a limits an upward movement of the movable block 24, so that the concave section for accommodating the substrate 31 is formed in the lower die 22. A position of the stopper 24a is designed that an upper face of the substrate 31, which is mounted on an upper face of the movable block 24, is slightly projected from an upper parting face of the lower die 22 while the molding die is opened.

A space formed under the movable block 24 is in communication with an air path 28 of the fixed block 26 when the work piece 30 is clamped between the upper and lower dies 20 and 22, so that an air path for air suction can be formed. A notch 24*b* is formed in a side face of the movable block 24. The notch 24*b* acts as an air path for air suction. The air path 28 is in communication with a vacuum unit 70, which is located outside of the press section "A", via tubes and an open-close valve.

In FIG. 3, a symbol 40 stands for the pot, and a symbol 42 stands for a plunger. The resin tablet 44 is melted in the pot 40 and exerted by the plunger 42. The plunger 42 sends the molten resin with proper pressure. The pot 40 and the connecting portion between the substrate 31 and the semiconductor chip 32 are communicated by a resin path 46. The resin path 46 is formed by grooving a groove in the parting face of the upper die 20. A gate 46*a* of the resin path 46 is communicated to the connecting portion.

The resin path 46 runs on the substrate 31, and sectional area of the gate 46*a* is smaller toward the connecting portion. With this structure, the molten resin can be efficiently introduced into the connecting portion, and the resin stuck on the substrate 31 can be reduced.

An air vent 48 is formed in the upper die 20 and provided on the opposite side of the gate 46*a* with respect to the work piece 30. Air left in the connecting portion is discharged via the air vent 48 when the work piece 30 is clamped by the upper die 20 and the lower die 22. Since the air vent 48 is provided on the opposite side of the gate 46*a*, the air can be easily discharged from the connecting portion.

The upper die 20 is held by a fixed block 27. The fixed block 27 is fixed to an upper base 52. A fixed block 26 of the lower die 22 is fixed to a lower base 54. The upper base 52 is fixed to the fixed platen 10; the lower base 54 is fixed to the movable platen 12.

The molding action of the resin molding machine will be explained.

Firstly, the molding die is opened, and the work pieces 30 and the resin tablets 44 are supplied into the press section "A" by the loader section "D". The loader section "D" drops the resin tablets 44 into the pots 40 and sets the work pieces 30 in the lower die 22. The whole parting face of the upper die 20 is covered with the release film 50. In the present embodiment, no air sucking mechanism, which is capable of fixing the release film 50 onto the parting face by air suction, is provided to the upper die 20. Air sucking holes may be opened in the parting face and an inner upper face of the concave section 23 of the parting face of the upper die 20. In this case, the release film 50 can be fitted and fixed onto the parting face and the inner face of the concave section 23 of the upper die 20 by air suction. Air suction from the parting face and air suction from the concave section 23 may be separately executed. Further, an inner face of the pot may be covered with another release film, which is separated from the release film 50 covering over the upper face 20 and which is extended from the pot to the gate of the resin path.

After the parting face of the upper die 20 is covered with the release film 50, the molding die is closed to clamp the work pieces 30 by the upper die 20 and the lower die 22 together with the release film 50. By clamping the work piece 30 between the upper die 20 and the lower die 22, the semiconductor chip 32 is accommodated in the concave section 23 of the upper die 20; the movable block 24 of the lower die 22 is moved downward, and the substrate 31 is accommodated in the lower die 22.

When the work pieces 30 are clamped by the upper die 20 and the lower die 22, the release film 50 is clamped by edge portions of the parting faces of the upper die 20 and the lower die 22. By clamping the release film 50, the release film 50 air-tightly seals the specific areas of the molding die.

In the present embodiment, the parting faces of the upper die 20 and the lower die 22 other than molding sections, e.g., the cavities, the resin paths, are flat faces, so that the dies 20 and 22 are capable of clamping the release film 50 when they clamp the work pieces 30. A symbol 22*a* stands for sealing section, which presses the release film 50 onto the flat parting face of the upper die 20 when the molding die is closed. Since the movable block 24 is capable of moving in the open-close direction of the molding die, the substrate 31 is moved downward when the molding die is closed. With this structure, the sealing section 22*a* can securely air-tightly seal the release film. The release film 50 has enough softness, so high air-tightness can be gained by clamping between the upper die 20 and the lower die 22.

The specific areas including the work pieces 30 are enclosed and air-tightly sealed with the release film 50. In this state, the vacuum unit 70 is driven so as to compulsorily discharge air from the pots 40, the resin paths 46 and the connecting portions of the work pieces 30 via the air path 28. FIG. 3 shows the state of discharging air from the pots 40, the resin paths 46 and the connecting portions of the work pieces 30. The air is discharged outside via a space between the movable block 24 and an inner face of a block hole, in which the movable block 24 is provided, and the air vent 48.

Discharging air is started after the work pieces 30 are clamped by the dies 20 and 22 and further executed while the resin, which has been melted in the pots 40, is sent to the resin paths 46. With this action, the air left in the sealed specific areas and air included in the resin tablets 44 can be compulsorily discharged outside. The air left in the connecting portions under the semiconductor chips 32 can be perfectly discharged via the air vent 48, so that the connecting portions can be securely filled.

When the connecting portions are filled with the resin, the vacuum unit 70 is stopped. The molding die is opened after the molded resin is solidified, and the molded products are taken out, by the unloader section "E", from the molding die.

After the molded products are taken out from the molding die, the surface of the lower die 22 is cleaned by the cleaner "F". By cleaning the lower die 22, the new work pieces 30 can be set in the lower die 22. On the other hand, the new release film 50 is fed onto the parting face of the upper die 20 for the next molding action. Note that, the release film 50 may be fed for every molding action or after a prescribed number of the molding actions have been executed.

The molding actions can be continuously executed by continuously supplying the work piece 30 into the molding die.

(Second Embodiment)

Figure 4:
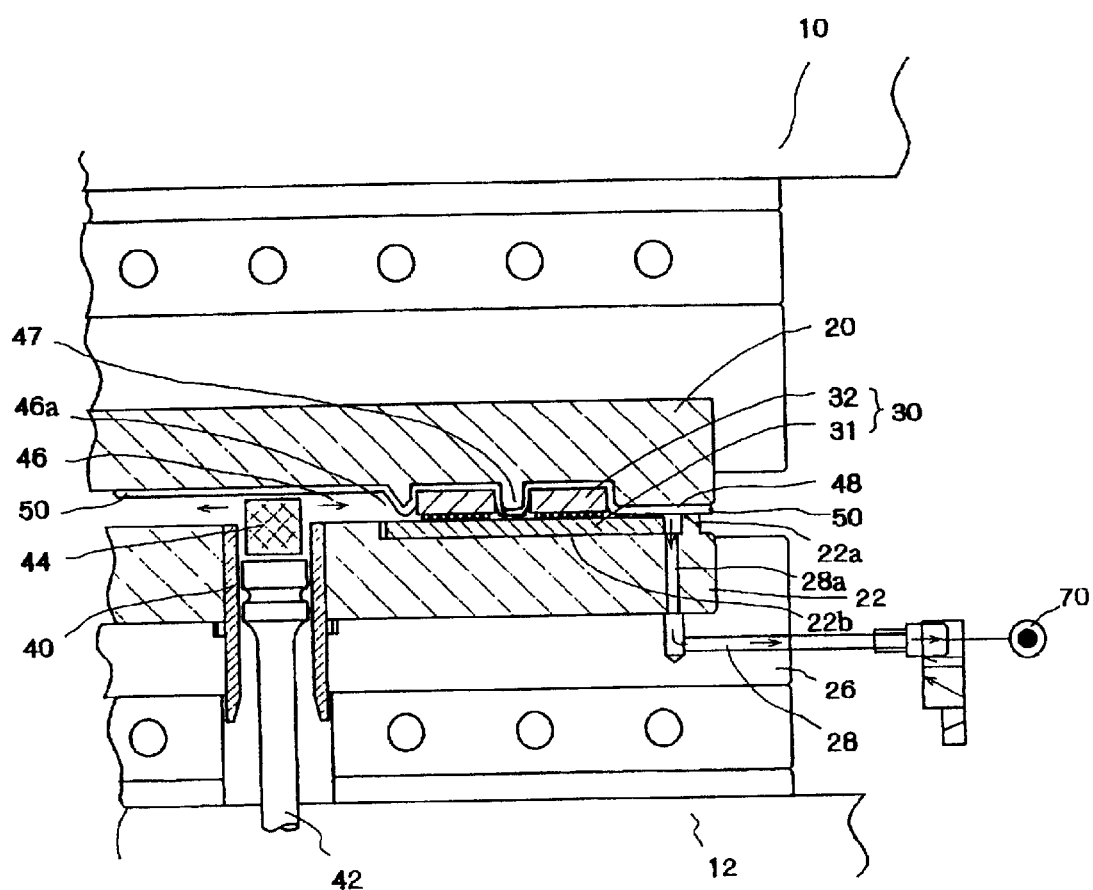
FIG. 4 is a sectional view of a molding die of a second embodiment.

In a resin molding machine shown in FIG. 4, strip-shaped substrates 31, on each of which the semiconductor chips 32 are matrically arranged, is molded as the work pieces 30. The semiconductor chips 32 are connected to the substrates 31 by flip-chip connection. The basic structure of the resin molding machine of the present invention is almost equal to that described in the first embodiment. The differences will be explained.

Concave sections for accommodating the semiconductor chips 32 are formed in the upper die 20. Their positions are corresponded to the semiconductor chips 32 on the substrate 31. The connecting portions of the semiconductor chips 32 will be filled with the resin. The adjacent connecting portions are communicated by communicating gates 47. Therefore, the connecting portions are filled, in order, with the resin sent from the pots 40. The air left in the specific areas, which have been airtightly sealed with the release film 50, are discharged via the air vent 48 formed in the upper die 20 only. The air vent 48 is formed in an edge section of the upper die 20 and located on the opposite side of the pot 40 with respect to the work piece 30.

Concave sections 22b are formed in the lower die 22. The work pieces 30 are respectively set in the concave sections 22b. Depth of each concave section 22b is equal to thickness of the substrate 31. A sealing section 22a is located on the outer side of the concave sections 22b and projected upward. The sealing section 22a presses the release film 50 onto the parting face of the upper die 20 when the work pieces 30 and the release film 50 are clamped by the upper die 20 and the lower die 22. The concave sections 22b are arranged on the both sides of the pots 40. The sealing section 22a is projected to enclose the pots 40 and the concave sections 22b. With this structure, the specific areas including the pots 40, the resin paths 46 and the connecting portions under the semiconductor chips 32, in which air is left, can be airtightly sealed with the release film 50 when the work pieces 30 and the release film 50 are clamped by the upper die 20 and the lower die 22.

One end of each air path 28a of the lower die 22 is opened in an inner bottom face of the concave section 22b and located near an outer edge of the concave section 22b. The other end of each air path 28a is communicated to the air path 28, which is formed in the fixed block 26 and connected to the vacuum unit 70.

Molding action of the resin molding machine of the present embodiment is equal to that of the first embodiment.

Firstly, the molding die is opened. The resin tablets 44 are dropped into the pots 40, and the work pieces 30 are set in the lower die 22. The whole parting face of the upper die 20 is covered with the release film 50. After the parting face of the upper die 20 is covered with the release film 50, the molding die is closed to clamp the work pieces 30 by the upper die 20 and the lower die 22 together with the release film 50. By clamping the work piece 30 between the upper die 20 and the lower die 22, the specific areas including the pots 40, the resin paths 46 and the connecting portions of the semiconductor chip 32, in which air is left, are air-tightly covered with the release film 50. By pressing the release film 50 by the sealing section 22a, the specific areas can be perfectly sealed with the release film 50.

In this state, the vacuum unit 70 is driven so as to compulsorily discharge air from the pots 40, the resin paths 46 and the connecting portions via the air paths 28 and 28a, the air vent 48 and the communicating gates 47. Discharging air is executed while the resin, which has been melted in the pots 40, is exerted and sent by the plungers 42. With this action, the air left in the sealed specific areas can be compulsorily discharged outside. The air left in the connecting portions under the semiconductor chips 32 can be perfectly discharged via the air vent 48, so that the connecting portions can be securely filled.

When the connecting portions are filled with the resin, the vacuum unit 70 is stopped. The molding die is opened after the molded resin is solidified, and the molded products are taken out from the molding die and accommodated in trays. The molded substrate 31 is cut to make a plurality of semiconductor devices whose connecting portions are filled with the resin.

(Third Embodiment)

Figure 5:
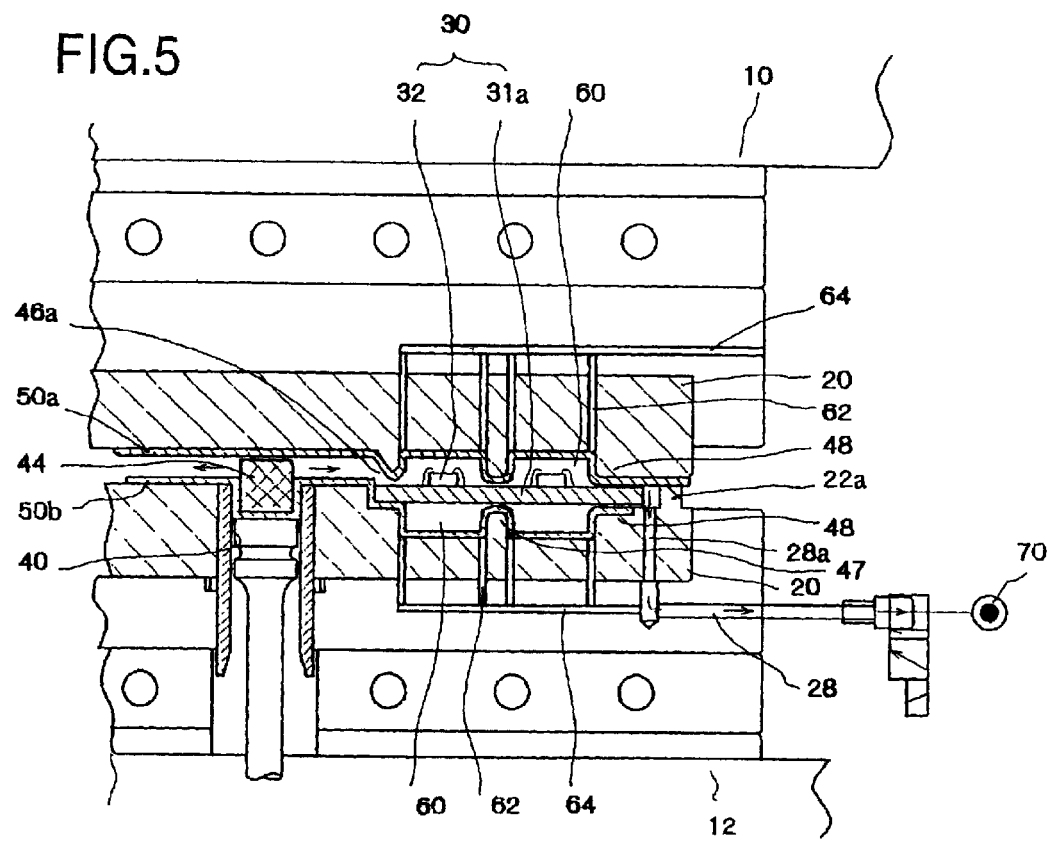
FIG. 5 is a sectional view of a molding die of a third embodiment.

FIG. 5 shows a resin molding machine, in which lead frames 31a, on each of which the semiconductor chips 32 are mounted, is molded as the work pieces 30. The parting face of the molding die is air-tightly sealed with the release film as well as the former embodiments.

Since the work piece 30 includes the lead frame 31a, cavities 60 are formed in the upper die 20 and the lower die 22. After the work pieces 30 are clamped, the cavities 60 are filled with the resin.

Positions of the cavities 60 are corresponded to those of the semiconductor chips 32 mounted on the lead frames 31a, which are correctly set in the lower die 22.

In the former embodiments, only the parting face of the upper die 20 is covered with the release film 50 so as to fill the resin in the connecting portions between the semiconductor chips 32 and the substrate 31. In the present embodiment, the cavities 60 are formed in the upper die 20 and the lower die 22, so the parting faces of the both dies are respectively covered with release films 50a and 50b.

Air paths 62 are opened in inner faces of the cavities 60. To fix the release films 50a and 50b along the inner faces of the cavities 60, air is sucked through the air paths 62. The air paths 62 are communicated to air paths 64, which are formed in the dies 20 and 22 and connected to another vacuum unit (not shown) for fixing the release film 50a and 50b to the dies 20 and 22.

In the resin molding machine of the present embodiment, concave sections, in which the work pieces 30 are set, are formed in the lower die 22. Depth of the concave section is equal to or slightly smaller than thickness of the lead frame 31a. The sealing section 22a, which is capable of pressing the release film 50a onto the parting face of the upper die 20 and air-tightly sealing the specific areas including the pots 40, the resin paths 46 and the cavities 60, in which air is left, is formed in the lower die 22. To compulsorily discharge the air from the molding die, the air vent 48 is formed in the upper die 20 and the communicating gates 47, which mutually communicate the cavities 60, are formed in the dies 20 and 22.

Molding action of the resin molding machine of the present embodiment is equal to that of the first embodiment.

Firstly, the molding die is opened. The parting faces of the upper die 20 and the lower die 22 are respectively covered with the release films 50a and 50b. Then, the release films 50a and 50b are fixed along the inner faces of the cavities 60 by sucking air through the air paths 62 and 64. In each pot 40, air may be sucked downward so as to fix the release film 50b on the inner face of the pot 40. With this action, a space in which the resin tablet 44 is accommodated can be formed in the pot 40. Note that, an upper open end of each pot 40 may be covered with the release film 50b without sucking the release film 50b downward. In this case, the resin tablet 44 and the release film 50b are pushed into the pot 40 when the upper die 20 and the lower die 22 clamp the work piece.

In the state of fixing the release films 50a and 50b on the parting faces of the upper die 20 and the lower die 22 by air suction, the work pieces 30 are set in the lower die 33 and the resin tablets 44 are supplied into the pots 40. Then, the upper die 20 and the lower die 22 clamp the work pieces 30 together with the release films 50a and 50b. By fixing the release films 50a and 50b along the inner faces of the cavities 60 by air suction, the work pieces 30 can be accommodated in the cavities 60 when the work pieces 30 are clamped. The sealing section 22a air-tightly seals the specific areas in the molding die, in which air is left.

In this state, the vacuum unit 70 is driven so as to compulsorily discharge air from the pots 40, the resin paths 46 and the cavities 60 via the air paths 28 and 28a, the air vent 48 and the communicating gates 47. Discharging air is executed while the resin, which has been melted in the pots 40, is exerted and sent by the plungers 42 to mold the semiconductor chips 32 mounted on the lead frames 3 1a. With this action, the air left in the scaled specific areas can be compulsorily discharged outside.

When the cavities 60 are fully filled with the resin, the vacuum unit 70 is stopped. The molding die is opened after the molded resin is solidified, and the molded products are taken out from the molding die. Resin scraps of the molded products, e.g., runners, culls are removed in a degating step, then the molded products are accommodated in trays.

The release films 50a and 50b are supplied for every molding action or after a prescribed number of the molding actions have been executed. The newly supplied release films 50a and 50b are also fixed along the inner faces of the cavities 60 by air suction for the next molding action. In the present embodiment too, air left in the molding die can be compulsorily discharged for high quality resin molding.

In the present embodiment, the sealing section 22a encloses and airtightly seals the specific areas, which have been covered with the release film, when the release film is clamped by the upper die 20 and the lower die 22. Note that, in the case of clamping elongated work pieces with the release film, the sealing section may be arranged to cross the work pieces. In this case, the release film has enough thickness capable of absorbing thickness of the work pieces.

(Fourth Embodiment)

A fourth embodiment will be explained with reference to FIGS. 6–9. The work piece 30 includes the substrate 31 and the semiconductor chips 32, which are matrically arranged on the substrate 31. The semiconductor chips 32 are connected to the substrate 31 by flip-chip connection.

The upper die 20 has: a center block 80 corresponding to the pots 40; cavity blocks 82 corresponding to the work pieces 30; and side blocks 84 constituting edge sections of the die. In the present embodiment, upper faces of the semiconductor chips 32 mounted on the substrate 31 are separated from a bottom face of each cavity block 82 when the work pieces 30 are clamped by the upper die 20 and the lower die 22. Air paths 82a are formed between the cavity block 82, the center block 80 and the side block 84. The air paths 82a are communicated to air paths 20a of the upper die 20. The air paths 20a are communicated to an air compressing mechanism (not shown) so as to introduce compressed air into the cavities.

To easily fill the connecting portions under the semiconductor chips 32 with the resin, each gate 46a corresponds to a center of a side of the semiconductor chip 32, which faces the pot 40, or a whole side thereof.

Air vents 84a are respectively formed in the side blocks 84. Spaces formed in the lower die 22 are communicated to the air vents 84a so as to discharge air from the molding die. Clamping projections 84b are pressing the release film 50 so as to air-tightly seal the specific areas when the work pieces 30 are clamped by the upper die 20 and the lower die 22.

As well as the former embodiments, width of the concave section 22b is slightly greater than that of the substrate 31 of the work piece 30. A gap is formed between an outer edge of the concave section 22b and a side face of the substrate 31 when an inner edge of the substrate 31 is made contact an inner edge of the concave section 22b to set the work piece 30 in the lower die 22. The air path 28 is connected to an external vacuum unit (not shown) so as to suck air therethrough.

Molding action of the resin molding machine of the present embodiment will be explained.

Firstly, the upper die 20 and the lower die 22 of the molding die are opened. The work pieces 30 are set in the concave sections 22b of the lower die 22, and the parting face of the upper die 20 is covered with the release film 50. The release film 50 need not be fixed on the parting face of the upper die 20 by air suction. Tension may be applied to the release film 50, which has covered over the parting face of the upper die 20, by the film feeding roller 32 and the film collecting roller 34.

Successively, the lower die 22 is moved upward to clamp the work pieces 30 by the upper die 20 and the lower die 22.

Figure 6:
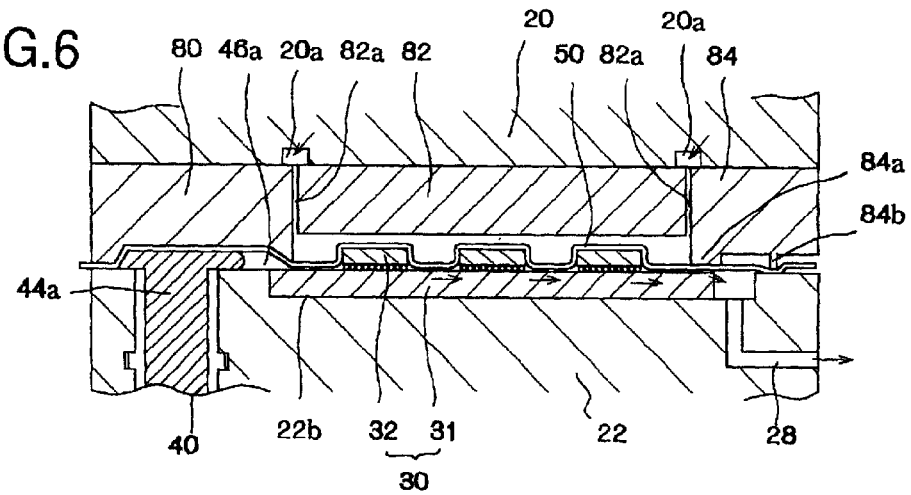
FIG. 6 is a sectional view of a molding die of a fourth embodiment.

In FIG. 6, the work piece 30 is clamped together with the release film 50, compressed air is introduced into the air paths 20a of the upper die 20 by the air compressing mechanism, and the air left in the molding die is discharged via the air path 28. The release film 50 covers the specific areas, and the clamping projection 84b encloses and airtightly seals the specific areas when the release film 50 is clamped by the dies 20 and 22. In this state, the vacuum unit sucks air to tightly fit the release film 50 along outer faces of the semiconductor chips 32 mounted on the substrates 31. If the release film 50 can be tightly fit on the outer faces of the semiconductor chips 32, no compressed air is required.

Figure 7:
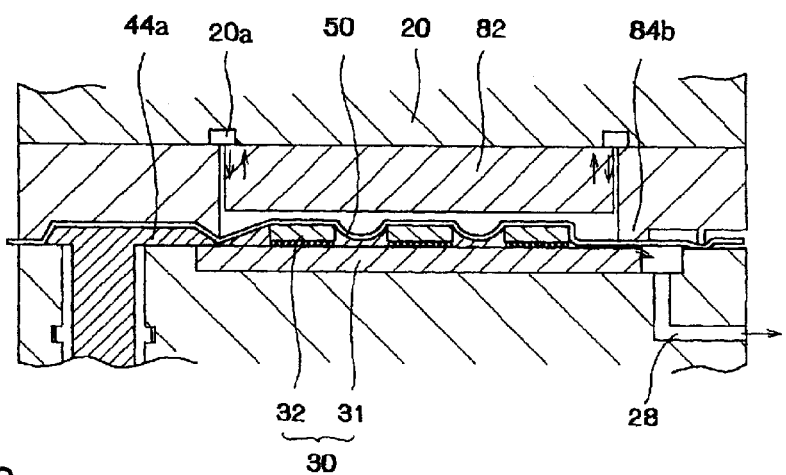
FIG. 7 is a sectional view showing a method of the fourth embodiment.

Next, the resin 44a melted in the pots 40 are exerted and sent by the plungers. In FIG. 7, the molten resin 44a is sent from the pot 40 to fill the connecting portions of the semiconductor chips 32 in order. The resin 44a sent form the pot 40 enters the connecting portion under the semiconductor chip 32 to fill the same. Air is discharged from the specific areas, which are covered with the release film 50 and which include the connecting portions, by the vacuum unit, via the air path 28 and the air vents 84a, so that the resin 44a can be easily introduced into the connecting portions under the semiconductor chips 32.

When the resin 44a fills the connecting portions of the semiconductor chips 32 located in an outermost raw and reaches the air vents 84a, the air vents 84a are closed by the resin 44a, so that resin pressure rises. By rising the resin pressure, the release film 50 is upwardly moved into the cavities.

Figure 8:
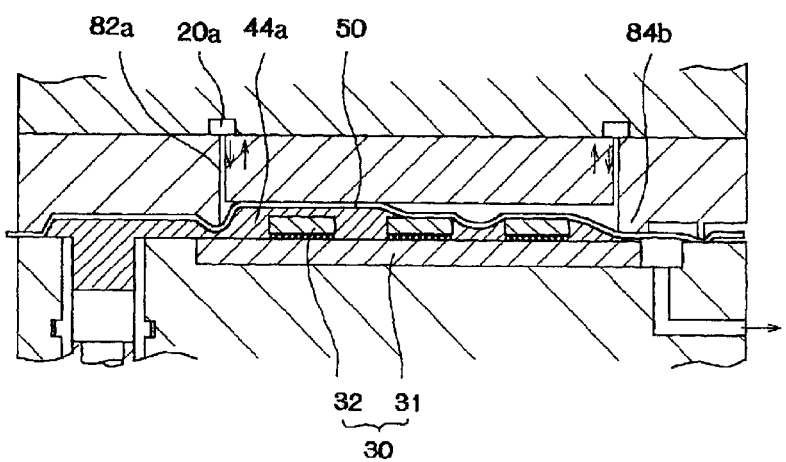
FIG. 8 is a sectional view showing the method of the fourth embodiment.

In FIG. 8, the air vent 84a is closed by the resin 44a, the release film 50 is pushed into the cavity, and the resin 44a is introduced into the cavity. When the resin 44a starts to fill the cavity, sending the compressed air, which is introduced into the cavity via the air paths 20a of the upper die 20, is stopped, so that the resin 44a can be easily introduced into the cavity. When the cavity is filled with the resin 44a, the vacuum unit, which is connected to the air paths 20a of the upper die 20, may suck air from the cavity via the air paths 82a.

Figure 9:
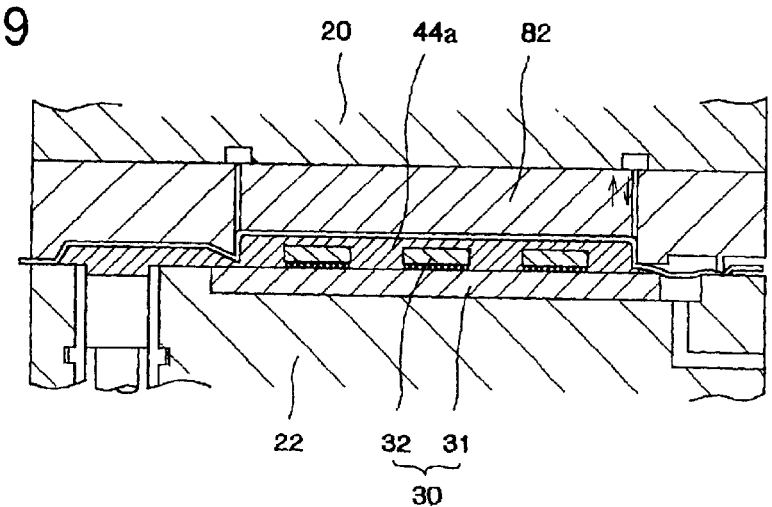
FIG. 9 is a sectional view showing the method of the fourth embodiment.

By exerting and sending the resin 44a form the pot 40 to the cavity, the cavity can be perfectly filled with the resin 44a. FIG. 9 shows the state in which the cavity is fully filled with the resin 44a. Since the bottom face of the cavity block 82 is separated away from the upper faces of the semiconductor chips 32, intermediate portions between the semiconductor chips 32 are also filled with the resin 44a, so that outer faces of the semiconductor chips 32 are wholly molded with the resin 44a.

The molded work pieces are cut by a proper manner, e.g., dicing, along each semiconductor chip 32 so as to produce semiconductor devices. In each of the semiconductor devices, the semiconductor chip 32 is electrically connected to the substrate by flip-chip connection, and the semiconductor chip 32 is wholly molded and protected by the resin 44a. With this structure, the semiconductor chip 32 can be protected from shock and heat-stress, so that highly reliable semiconductor devices can be produced. In the present embodiment, the step of filling the connecting portions of the semiconductor chips 32 and the step of molding the outer faces thereof are continuously executed, so the resin molding can be securely and efficiently executed.

(Fifth Embodiment)

A fifth embodiment will be explained with reference to FIGS. 10–13.

The features of the present embodiment are the cavity block 82, which is capable of moving in the open-close direction of the molding die, is always biased toward the lower die 22 by elastic members 86. Other structures of the upper die 20 and the lower die 22 are equal to those of the Fourth Embodiment.

Figure 10:
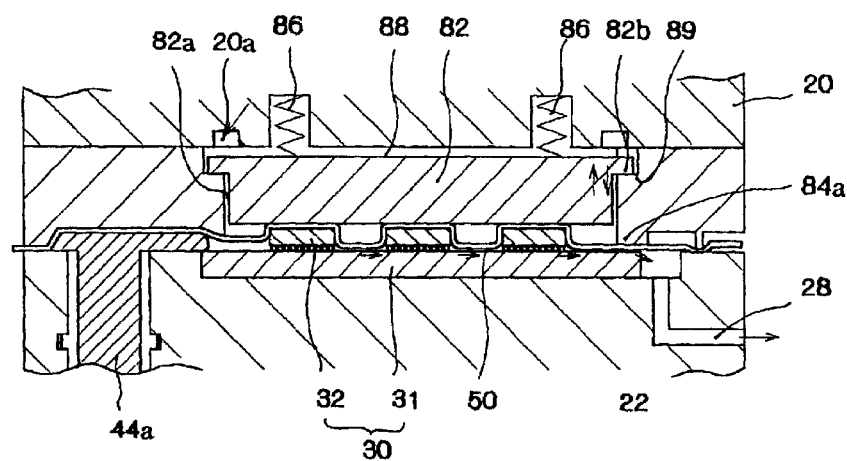
FIG. 10 is a sectional view of a molding die of a fifth embodiment.

As shown in FIG. 10, the cavity block 82 is provided in a hole 88 of the upper die 20 and capable of sliding in the open-close direction of the molding die. Stopper step sections 89 are formed in inner faces of the hole 88; flange sections 82b, which is capable of engaging with the stopper step sections 89, are formed in an upper part of the cavity block 82. The cavity block 82 is always biased toward the lower die 22 by the elastic members 86. Therefore, the flange sections 82b engages with the stopper step sections 89.

In FIG. 10, the work piece 30 is set in the lower die 22 and clamped together with the release film 50. Sending the resin 44a is just started. As shown in the drawing, a bottom face of the cavity block 82 downwardly presses upper faces of the semiconductor chips 32 with the release film 50 when the work piece 30 is clamped.

When sending the resin 44a is started, air left around the work piece 30 is discharged outside, by the vacuum unit, via the air path 28 of the lower die 22 and the air vent 84a. On the other hand, compressed air is introduced into the cavity via the air paths 20a and 82a of the upper die 20, so the release film 50 can be fit on the outer faces of the semiconductor chips 32 as well as the fourth embodiment.

Figure 11:
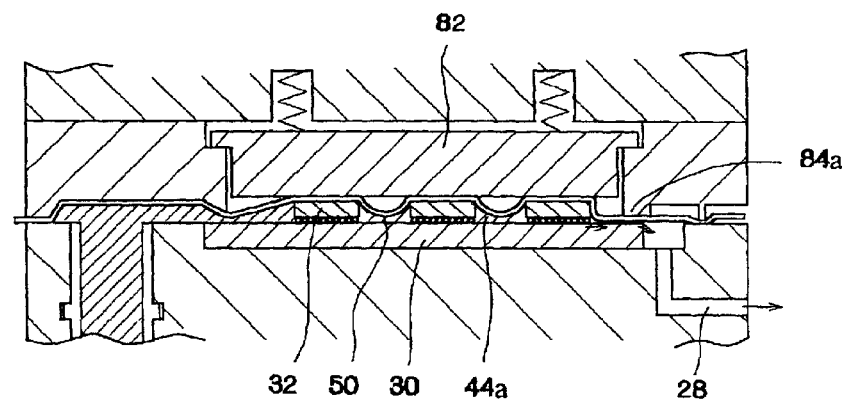
FIG. 11 is a sectional view showing a method of the fifth embodiment.

In FIG. 11, the resin 44a is gradually pushed into the connecting portions under the semiconductor chips 32. When the resin 44a reaches and closes the air vent 84a, resin pressure in the cavity rises and the release film 50 is upwardly lifted by the resin 44a.

Figure 12:
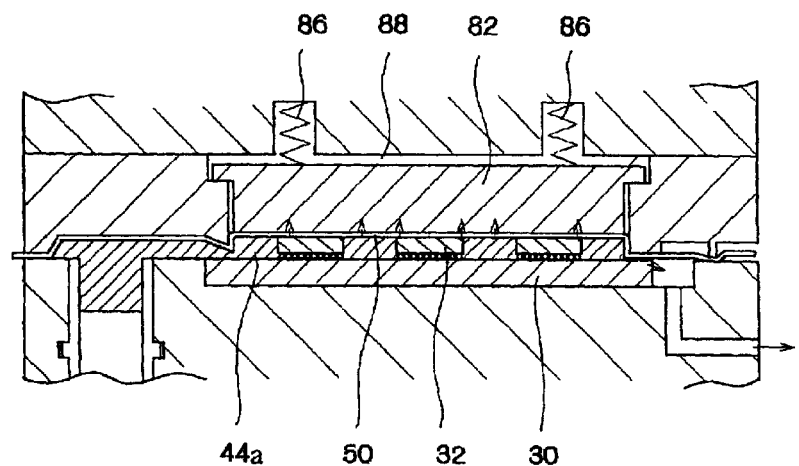
FIG. 12 is a sectional view showing the method of the fifth embodiment.

In FIG. 12, the connecting portions of the semiconductor chips 32 and intermediate portions between the semiconductor chips 32 have been fully filled with the resin 44a. In the present embodiment, the cavity block 82 is downwardly biased by the elastic members 86, so the semiconductor chips 32 is molded in a state that the cavity block 82 is located at a lower end position, and the side faces of the semiconductor chips 32 are enclosed and molded with the resin 44a.

Figure 13:
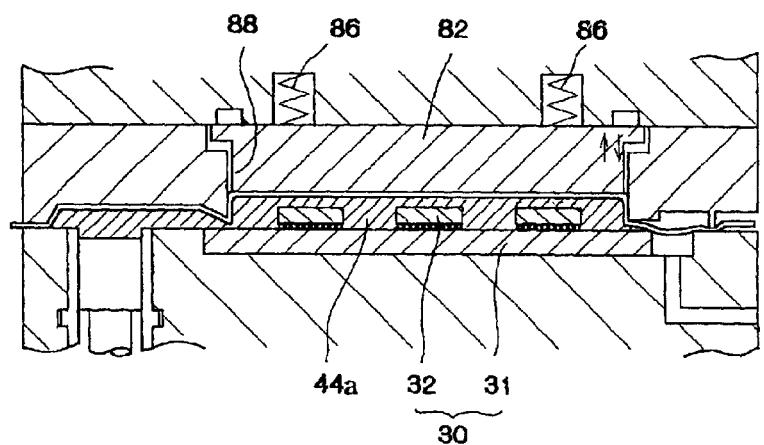
FIG. 13 is a sectional view showing the method of the fifth embodiment.

In FIG. 13, the cavity block 82 is upwardly moved, against elasticity of the elastic members 86, by resin pressure, so that the upper faces of the semiconductor chips 32 are also molded with the resin 44a. The cavity block 82 is upwardly moved until an upper face of the cavity block 82 contacts an inner upper face of the hole 88, so that the cavity can have predetermined capacity for molding.

Note that, in the present embodiment, the upper faces and the side faces of the semiconductor chips 32 are molded with the resin 44a. In some cases, the upper faces may be exposed.

When the state shown in FIG. 12 is transferred to the state shown in FIG. 13, the cavity block 82 is lifted by the resin pressure, and the resin 44a finally mold the upper faces of the semiconductor chips 32. This action will be explained with reference to FIGS. 14–17.

Figure 14:
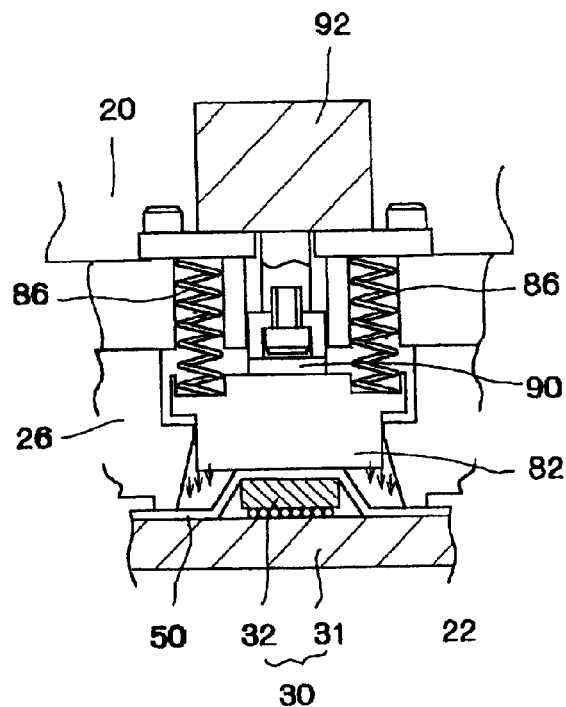
FIG. 14 is a sectional view of a molding die, in which a substrate, on which a semiconductor chip is mounted, is molded.

In FIGS. 14–17, the work piece 30 has the substrate 31 and one semiconductor chip 32. FIG. 14 shows a state of clamping the work piece 30, together with the release film 50, between the upper die 20 and the lower die 22. The cavity block 82, which has been downwardly moved by the elastic members 86, elastically contacts the upper face of the semiconductor chip 32 of the work piece 30.

Figure 16:
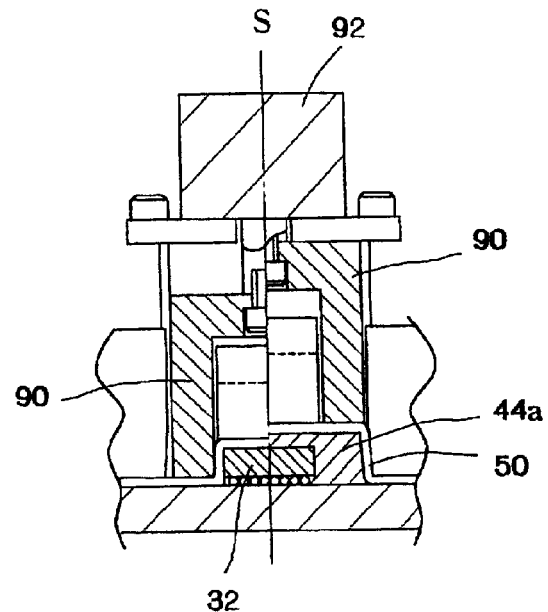
FIG. 16 is a sectional view of a molding die, in which a substrate, on which a semiconductor chip is mounted, is molded.

In this example, covering members 90 cover the side faces of the semiconductor chip 32 so as to securely fill the connecting portion of thereof with the resin. Action of the covering members 90 is shown in FIG. 16. The covering members 90 cover the side faces of the semiconductor chip 32 when the connecting portion is filled with the resin; the covering members 90 is upwardly moved to allow the resin to mold the side faces of the semiconductor chip 32 after the connecting portion is filled with the resin.

Figure 18:
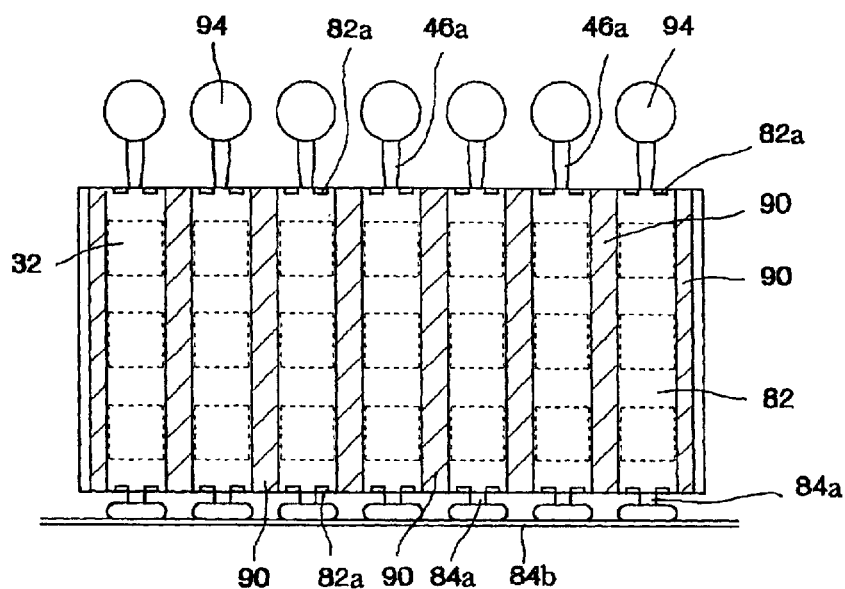
FIG. 18 is a plan view of an upper die having a covering member.

FIG. 18 is a plan view of the upper die 20 having the covering members 90. FIG. 18 shows one side of the upper die 20. Symbols 94 indicates culls of the die 20. A plurality of covering members 90 are arranged to correspond to lines of the semiconductor chips 32. The cavity blocks 82 are provided between the covering members 90. The gates 46a are respectively connected to parts, each of which is sandwiched between the covering members 90 and filled with the pressurized resin via the gate 46a.

Note that, planar arrangement of the air paths 82a, the air vents 84a and the clamping projection 84b shown in FIG. 18 is employed in the former embodiments, too.

FIG. 14 shows a state in which the release film 50 is fitted by air suction, the compressed air is applied to the release film 50, and the connecting portion of the semiconductor chip 32 will be filled with the resin.

Figure 15:
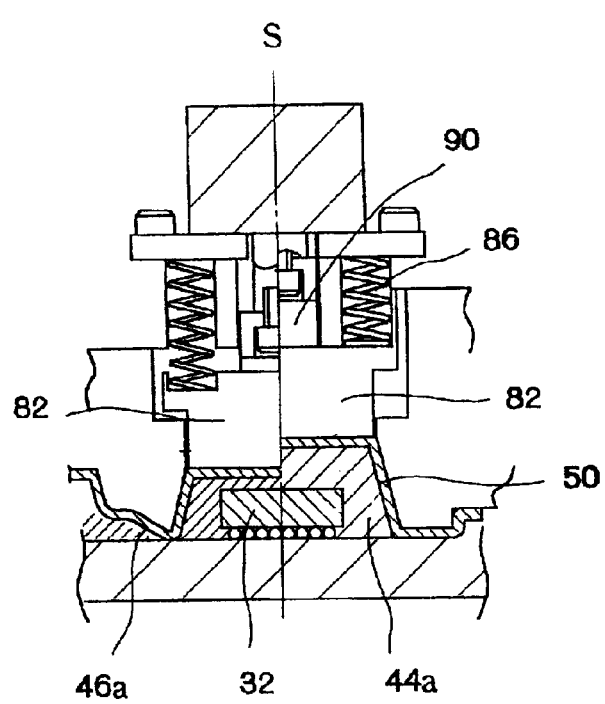
FIG. 15 is a sectional view of a molding die, in which a substrate, on which a semiconductor chip is mounted, is molded.

In FIG. 15, a state in which the connecting portion of the semiconductor chip 32 is filled with the resin 44a and the side faces of thereof are molded with the resin 44a is shown on the left side of a center line "S"; a state in which the cavity block 82 is lifted by the resin pressure and the outer faces of the semiconductor chip 32 are wholly molded with the resin 44a is shown on the right side of a center line "S".

In FIG. 16, the state of filling the connecting portion of the semiconductor chip 32 with the resin is shown on the left side of a center line "S"; the state of molding the side faces of the semiconductor chip 32 after filling the connecting portion is shown on the right side of the center line "S". When the connecting portion under the semiconductor chip 32 with the resin, the covering members 90 cover the side face of the semiconductor chip 32, which are parallel to the direction of the resin flow. With this structure, the connecting portion can be filled, with the resin 44a, from a front end to a rear end without leaking the resin 44a sideward. The covering members 90 are vertically moved by a driving mechanism 92, e.g., an air cylinder unit, an electric motor.

Figure 17:
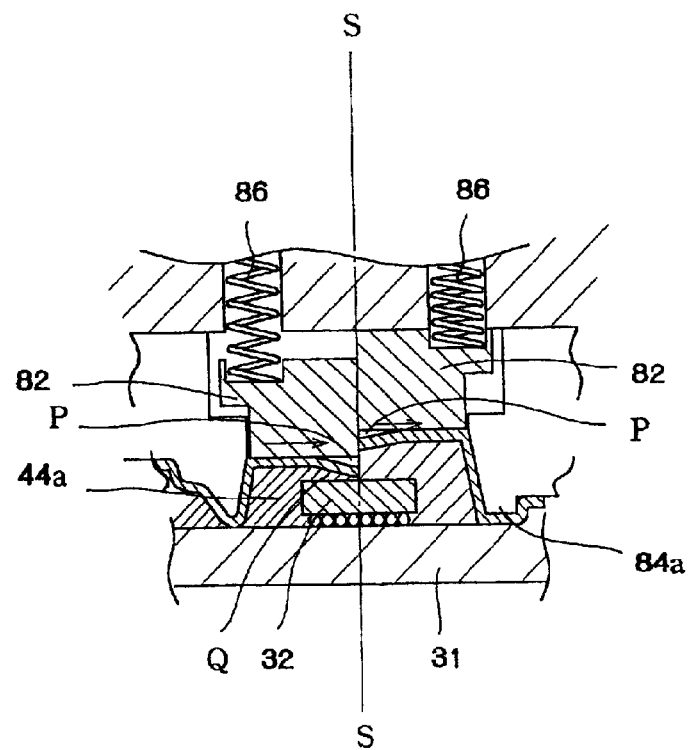
FIG. 17 is a sectional view of a molding die, in which a substrate, on which a semiconductor chip is mounted, is molded.

In FIG. 17, the resin 44a lifts the cavity block 82 to fill the cavity. A state of starting to lift the cavity block 82 is shown on the left side of a center line "S"; a state in which the cavity block 82 reaches an uppermost position and the resin 44a fully fills the cavity is shown on the right side of the center line "S".

When the side faces of the semiconductor chip 32 are molded with the resin 44a and the air vent 84a is closed by the resin 44a, the resin pressure rises and lifts the cavity block 82 against the elasticity of the elastic members 86.

The cavity block 82 is lifted by the pressure of the resin 44a which covers the side faces of the semiconductor chip 32, so a space "P" (see FIG. 17) is formed, between the bottom face of the cavity block 82 and the release film 50, at a center of the cavity when the resin 44a begins to lift the cavity block 82. On the side faces of the semiconductor chip 32, the resin 44a gradually rises from the gate side. Further, the resin 44a gradually molds the upper face (a part "Q") of the semiconductor 32 and lifts the cavity block 82.

By filling the resin 44a, the resin 44a molds a part under the space "P", so that the cavity block 82 is lifted. When the cavity block 82 reaches the uppermost position, the part under the space "P" is fully filled with the resin 44a, then the molding action is completed.

In the state shown on the right side of the center line "S" of FIG. 17, air lift in the space "P", which is formed between the cavity block 82 and the release film 50, must be discharged so as to fully fill the part under the space "P" with the resin 44a. If the bottom face of the cavity block 82 is formed into a satin finished face, the air can be easily discharged, and the part under the space "P" can be easily filled with the resin 44a. The air left in the cavity has been discharged by the vacuum unit, no voids are formed when the upper face of the semiconductor chip 32 is finally molded with the resin 44a, so high quality products can be produced.

Figure 19:
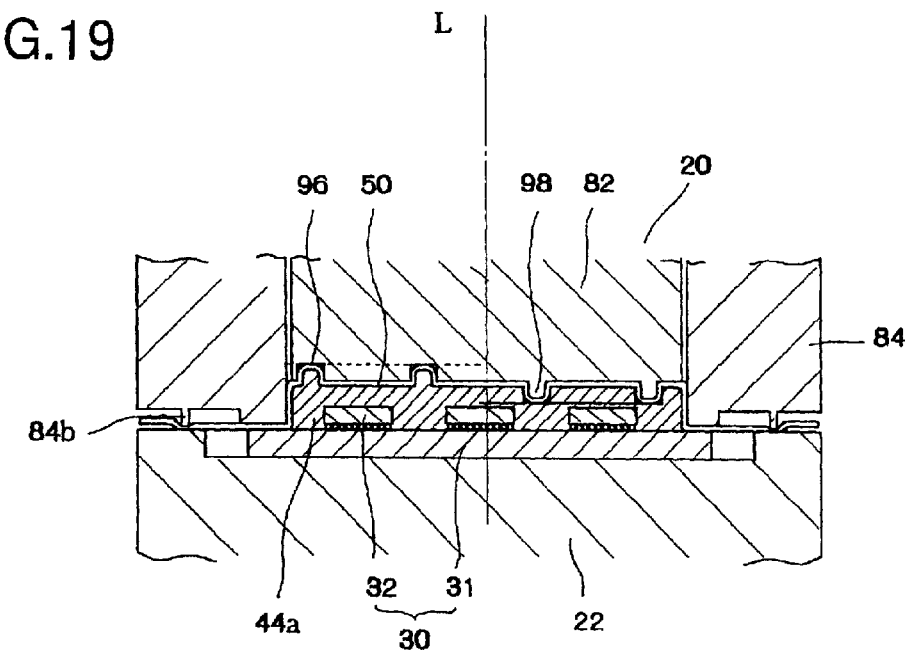
FIG. 19 is a sectional view of a molding die having absorbing sections for absorbing slackened parts of release film.

In FIG. 19, the connecting portions and the intermediate portions of the semiconductor chips 32 are filled with the resin 44a, and the resin 44a lifts the release film 50 to fully fill the cavity. In this case, the release film 50 is extended and slackened, so wrinkles are apt to be formed in the release film 50. To remove the wrinkles, absorbing grooves 96, which is capable of absorbing the slackened part of the release film 50, are formed in the bottom face of the cavity block 82 (see on the left side of a center line "L" of FIG. 17; absorbing projections 98, which is capable of absorbing the slackened part of the release film 50, are formed in the bottom face of the cavity block 82 (see on the right side of the center line "L". The absorbing grooves 96 and the absorbing projections 98 are located to prescribed positions, which never badly influence the final products, and will be removed from the final products.

(Sixth Embodiment)

Figure 20:
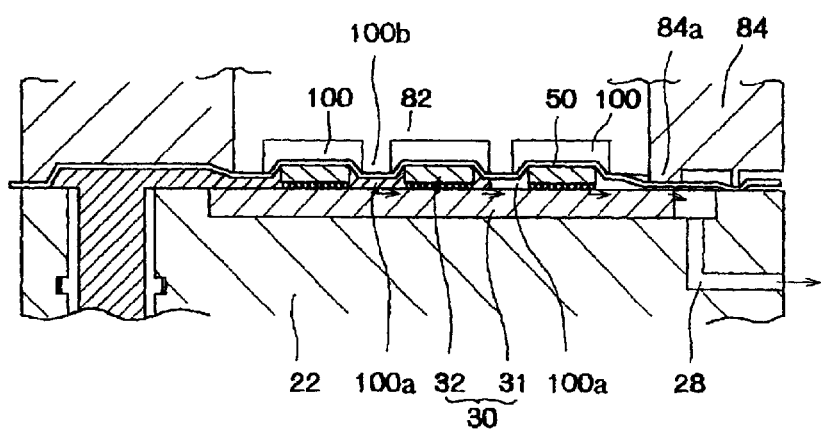
FIG. 20 is a sectional view of a molding die, in which a plurality of semiconductor chips are respectively molded with resin.
Figure 21:
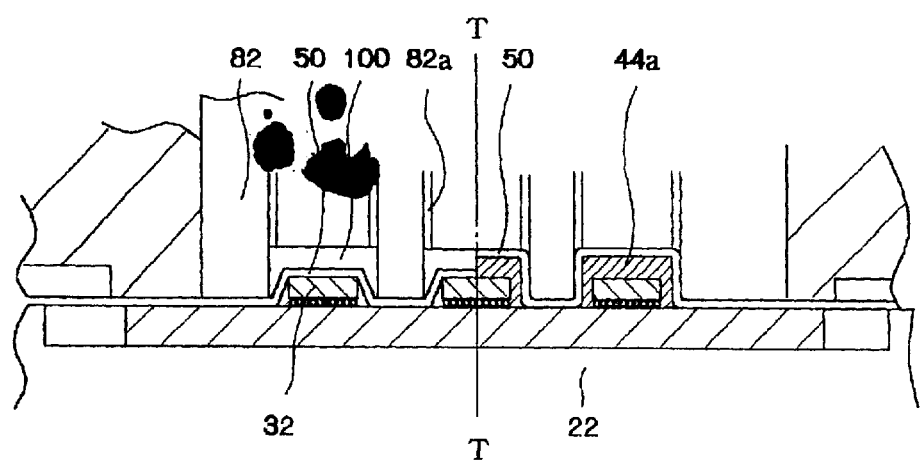
FIG. 21 is a sectional view of a molding die, in which a plurality of semiconductor chips are respectively molded with resin.

In FIGS. 20 and 21, the semiconductor chips 32 are matrically arranged on the substrate 31. Unlike the former embodiments, a plurality of the semiconductor chips 32 are not molded in one cavity. The semiconductor chips 32 are respectively molded in cavities 100, which are formed in the bottom face of the cavity block 82 and which respectively correspond to the semiconductor chips 32 set in the lower die 22. The semiconductor chips 32 are respectively accommodated in the cavities 100 when the work piece 30 is clamped by the upper die 20 and the lower die 22 together with the release film 50. Communication grooves 100a are formed in partitions 100b, which act as walls between the cavities 100. With this structure, the resin 44a, which has exerted and sent from the pot, can be introduced into the cavities 100 in order.

In FIG. 21, a state in which the work piece 30 is covered with the release film 50, the release film 50 is tightly fitted on the outer faces of the semiconductor chips 32 and the connecting portions under the semiconductor chips 32 are filled with the resin 44a is shown on the left side of a center line "T"; a state in which the release film 50 is upwardly lifted by the resin pressure and the resin 44a fully fills the cavities 100 along inner faces of the cavities 100 is shown on the right side of the center line "T". Compressed air is introduced from the air paths 82a.

In the present embodiment, the semiconductor chips 32 mounted on the substrate 31 can be molded respectively. The connecting portions of the semiconductor chips 32 are firstly filled with the resin 44a, then the whole outer faces of the semiconductor chips 32 are fully molded.

The semiconductor chips 32 are electrically connected to the substrate 31 by flip-chip connection. But the present invention can be applied to other electronic devices, e.g., SOJ semiconductor devices, PLCC semiconductor devices, SOP semiconductor devices, QFP semiconductor devices, chip resistances, chip capacitors. The work piece 30 may include one kind of electronic devices or a plurality of kinds of electronic devices. In the case of the work piece including a plurality of kinds of electronic devices, size and height of electronic devices are different, so the resin flow is varied in the molding die. To uniformly flow the resin, the size and the height of the cavities are adjusted on the basis of those of the electronic devices. Thickness of the resin may be changed on the basis of products.

In the present invention, the specific area, e.g., a cavity, a pot, a resin path, of a molding die, in which air is left, is covered with the release film, and the work piece is clamped by the molding die together with the release film, so that the specific area can be air-tightly sealed. Further, the air left in the specific area can be compulsorily and perfectly discharged from the sealed specific area. Therefore, no air is involved in the resin for molding the work piece, so that no voids are formed in molded products and high quality products can be produced.

The release film has enough softness, so the specific areas can be highly air-tightly sealed with the release film. If the new release film is supplied after a prescribed number (one or more) of the molding actions have been executed, the release film deteriorated by heat of the molding die are exchanged, so that proper sealing property of the release film can be maintained. The release film never obstructs to clean the molding die, and the release film is not damaged when the molding die is cleaned by brushes, etc. As explained in the fourth to sixth embodiments, the present invention can be applied to the cases, in which the electronic devices are matrically arranged on the substrate and filling the connecting portions with the resin and molding the outer faces of the electronic devices with the resin can be executed in one step.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of resin molding, comprising the steps of:
   covering a specific area of a molding die, in which air is left, with release film;
   clamping a substrate, in which an electric device is mounted on one face, and the release film between an upper die and a lower die of the molding die so as to air-tightly seal the specific area;
   discharging the air from the sealed specific area; and
   filling a molding section with resin,
   wherein the release film covers a whole parting face of the molding die, which faces a pot thereof:

wherein the one face of the substrate is covered with the release film in said covering step, the one face of the substrate is air-tightly sealed in said clamping step, and wherein an air vent is formed in at least one of the upper die and the lower die, the air is discharged from the sealed specific area via the air vent.

2. The method according to claim 1, wherein the one face of the substrate is covered with the release film, and the substrate is clamped by the molding die, outer faces of the electronic device are covered with the release film by discharging the air from the sealed specific area, and the resin is exerted in a pot and sent to mold the electronic device.

3. The method according to claim 1, wherein the molding die has a concave section, which is capable of accommodating the electronic device, outer faces of the electronic device are covered with the release film by clamping the the substrate and the release film with the molding die, the resin is exerted in the pot and sent to mold the electronic device, the release film tightly fits onto the outer faces of the electronic device when the air is discharged, and a space between the substrate and the electronic device is filled with the resin.

4. The method according to claim 1, wherein the one face of the substrate is covered with the release film, and the substrate is clamped in a state, in which the outer faces of the electronic device are separated from an inner bottom face of a cavity, the outer faces of the electronic device are covered with the release film by discharging the air, a connecting portion between the electronic device and the substrate is filled with the resin, which has been exerted in and sent from a pot, and the release film is pushed into the cavity by pressure of the resin, which is further sent to fill the cavity and wholly mold the electronic device.

5. The method according to claim 1, wherein the one face of the substrate is covered with the release film, and the substrate is clamped in a state, in which the outer faces of the electronic devices are respectively pressed on inner bottom faces of the cavities, the outer faces of the electronic devices are covered with the release film by discharging the air, connecting portions between the electronic devices and the substrate and an intermediate portion between the adjacent electronic devices are filled with the resin.

6. The method according to claim 1, wherein an inner bottom face of a cavity is constituted by a cavity block, which is capable of elastically moving in the open-close direction of the molding die, one face of the substrate is covered with the release film, and the substrate is clamped in a state, in which an outer face of the electronic device is elastically pressed on the inner bottom face of the cavity, the outer faces of the electronic device are covered with the release film by discharging the air, a connecting portion between the electronic device and the substrate is filled with the resin, which has been exerted in and sent from a pot, and the cavity block is pushed by pressure of the resin, which is further sent to fill the cavity and wholly mold the electronic device.

7. The method according to claim 1, wherein the substrate, whose one face is covered with the release film, is clamped, and air pressure is applied in the direction of tightly fitting the release film onto one face of the substrate and outer faces of the electronic device.

8. The method according to claim 1, wherein new release film is supplied after a prescribed number of the molding actions have been executed.

9. The method according to claim 1, wherein said step of discharging reduces air pressure in the sealed specific area, and said step of filling is performed after said step of discharging.

10. The method according to claim 9, wherein said step of discharging discharges air from a side of said release film which faces said substrate.

* * * * *